(12) United States Patent
Kumar et al.

(10) Patent No.: US 7,717,004 B2
(45) Date of Patent: *May 18, 2010

(54) WHEEL SENSOR ASSEMBLY FOR RAIL BASE MOUNTING

(75) Inventors: Sudhir Kumar, Darien, IL (US); Venkat Dyavanapalli, Glendale Heights, IL (US)

(73) Assignee: Tranergy Corporation, Bensenville, IL (US)

( * ) Notice: Subject to any disclaimer, the term of this patent is extended or adjusted under 35 U.S.C. 154(b) by 165 days.

This patent is subject to a terminal disclaimer.

(21) Appl. No.: 11/744,567

(22) Filed: May 4, 2007

(65) Prior Publication Data

US 2007/0204705 A1    Sep. 6, 2007

Related U.S. Application Data

(63) Continuation of application No. 10/679,099, filed on Oct. 3, 2003, now Pat. No. 6,903,669.

(51) Int. Cl.
    *G01D 21/00* (2006.01)
(52) U.S. Cl. .................................................. 73/866.5
(58) Field of Classification Search .................... 73/788, 73/146, 865.5, 620; 248/157, 295.1, 243–246, 248/63; 324/217, 207.11, 207.22, 207.26, 324/179–180, 207.15–207.19; 33/302, 203.11, 33/1 Q; 246/122 R, 108, 123, 125, 127, 246, 246/247, 249
See application file for complete search history.

(56) References Cited

U.S. PATENT DOCUMENTS

| | | | | |
|---|---|---|---|---|
| 3,119,017 A | * | 1/1964 | Kaehms ................... | 250/338.1 |
| 3,941,338 A | * | 3/1976 | Knudsen ....................... | 246/77 |
| 4,524,932 A | * | 6/1985 | Bodziak ..................... | 246/247 |
| 4,970,463 A | * | 11/1990 | Wolf et al. ................ | 324/207.2 |
| 5,050,634 A | * | 9/1991 | Fiechtner ..................... | 137/486 |
| 5,158,253 A | * | 10/1992 | Burghoff et al. ............ | 246/246 |
| 5,582,371 A | * | 12/1996 | Humphrey et al. .......... | 246/453 |
| 5,628,479 A | * | 5/1997 | Ballinger .................... | 246/249 |
| 7,032,829 B2 | * | 4/2006 | Schwarzbich ............... | 238/281 |
| 7,216,558 B2 | * | 5/2007 | Kumar et al. .............. | 73/866.5 |

* cited by examiner

*Primary Examiner*—Robert R Raevis
(74) *Attorney, Agent, or Firm*—Cook Alex Ltd.

(57) ABSTRACT

A rail-mounted, wheel-sensing system is shown having a wheel sensor and a rail mounting platform. The system includes a rugged steel rail clamp including two blocks mounted on the base of the rail by a pair of bolt extending under the rail. One block is connected to a vertically adjustable mounting bracket for carrying a sensor or other device. The mounting bracket includes a platform for the sensor. Two shields on the platform protecting a sensor mounted between them. An adapter plate may be added between the mounting bracket and the clamp for installation on lighter or heavier rails.

35 Claims, 6 Drawing Sheets

WHEEL SENSOR ASSEMBLY FOR RAIL BASE MOUNTING

RELATED APPLICATION

This application is a continuation of U.S. patent application Ser. No. 10/679,009 filed Oct. 3, 2003 now U.S. Pat. No. 6,903,669 and entitled "WHEEL SENSOR ASSEMBLY FOR RAIL BASE MOUNTING".

BACKGROUND OF THE INVENTION

The present invention relates generally to a railroad car wheel sensor assembly, and more particularly, to a rail-mounted, wheel-sensing system having a wheel sensor and a mounting bracket therefor.

Today's railroads need to detect the presence of wheels at certain locations on the track. Electrically inductive sensors are often used for this purpose. These sensors, along with their mounting systems, need to be treated as an integrated, matched system this is optimized for freight rail in North America. This means accounting for the effects of heavy haul loads on Class II, III or IV tracks at moderate speeds (10 to 70 miles per hour) and achieving a product cost point which is lower than that of conventional systems.

Rails experience a depression, and almost a shock, when a wheel travels on them. It is therefore necessary that any rail-mounted system for wheel sensors be very rugged and not subject to loosening with vibration over time. In the United States, freight trains generally travel at speeds of up to 70 miles per hour. Presently available wheel sensors are designed for high speed rail travel over 200 miles per hour; however, their mounting brackets are not stout enough to withstand freight traffic conditions.

A further requirement of the railroad industry is that a rail-mounted system be relatively easy and quick to install, particularly with respect to alignment with the rail. Currently available sensors require both vertical and horizontal alignments, which may be difficult to achieve simultaneously. Wheel sensors mounted on these systems are frequently damaged or do not operate correctly either because they are hit by equipment hanging from rail cars or because their brackets are not able to hold them in position over time. Sensors therefore require protection from impacts of dragging equipment with passing cars and resistance to misalignment caused by such impacts and by vibration.

In view of the foregoing, it is desirable to develop a rail-mounted, wheel-sensing system having a wheel sensor which is suitable for U.S. railroad speeds (less than 80 miles per hour).

SUMMARY OF THE INVENTION

An object of the present invention is a rail-mounted, wheel-sensing system having a rugged bracket on which the sensor is mounted which will resist misalignment of the sensor due to vibration of the rails and impacts with the sensor and/or bracket.

A further object of the invention is a rail-mounted, wheel-sensing system having a wheel sensor which requires only a vertical adjustment.

Another object of the invention is a rail-mounted, wheel-sensing system having shields for protecting the wheel sensor from articles hanging from passing rail cars.

These and other desired benefits of the preferred forms, including combinations of features thereof, of the invention will become apparent from the following description. It will be understood, however, that a device could still appropriate the claimed invention without accomplishing each and every one of these desired benefits, including those gleaned from the following description. The appended claims, not these desired benefits, define the subject matter of the invention.

In view of the desired goals of the invention claimed herein, a rugged rail-mounted wheel-sensing system is described comprising a steel rail clamp having two blocks mounted on the base of the rail and connected by a pair of bolts. The standard blocks are designed for heavy haul rail (132 RE and above). For use on lighter rail such as 115 RE or 119 RE, an adapter plate is added for accurate installation. The rail-mounted wheel-sensing system further includes a vertically adjustable mounting bracket for mounting sensors or other devices. The bracket is adjustably fixed to one of the clamp blocks. The system is constructed so that only the distance of the sensor below the rail head (approximately 1.75 inches) needs to be set, making it easier to install. In the preferred embodiment, an inductive type wheel sensor with a vertical wheel sensing range of 2 inches or more is mounted on the bracket. Two shields made of non-inductive material are also mounted on the bracket, one shield on each side of the sensor. The base of the shields may have a layer of shock-reducing material under them. This rail-mounted wheel-sensing system is thus designed to match the requirements of the North American railroad industry, including a lower price than conventional systems. Moreover, it is also suitable for heavy haul railroad conditions and moderate speeds (less than 80 miles per hour) and passenger traffic.

DETAILED DESCRIPTION OF THE INVENTION

The present invention is designed to provide a railroad car wheel sensor assembly which is mounted on a rail. It includes a wheel sensor on a mounting bracket attached to a rail clamp. The bracket is vertically adjustable on the clamp. Shields on the bracket provide protection from impacts with articles hanging from passing rail cars. In a preferred embodiment, it is desirable to optimize the specifications of the wheel-sensing system in order to comply with and be best suited for North American rail freight applications. More specifically, the North American rail freight applications require the following:

Mounting a sensor bracket on the rail web requires drilling holes in the web which can lead to fractured rails. Mounting a bracket on the base of the rail is therefore less damaging and quicker.

A sensing system should have an extremely rugged sensor mounting clamp and bracket. North American heavy haul traffic has an extreme impact vibration load on rail, particularly because Class III track is often used in the railroad industry. A heavy duty rail mounting assembly should be able to withstand these loads and also not fail in the mounting process.

The sensor should be able to withstand moderate impacts from dragging equipment, which is common in North American rail traffic.

The sensor should have a wide range of sensitivity so that adjustments needed during installation and maintenance are minor, if necessary at all. In other words, the sensor should work properly even if it was not mounted with great care.

Under North American railroad conditions, the lateral movement of a wheel flange relative to the rail can be as much as 2 inches, and sometimes higher. The sensor should have a large sensing area so that worn wheels and out of gauge rail do not affect the sensing of wheel flanges.

The sensor does not have to detect wheels at very high speeds. Speed sensitivity up to 100 miles per hour is quite adequate for North American rail traffic.

The cost of current wheel sensor mounting assemblies is high. If the range of speed for which the sensor is designed is only up to limits of American rail speeds, the cost of the sensor can be reduced. Therefore, it is desirable that the cost of the total wheel sensor assembly be lowered as much as possible compared to the cost of prior units.

Figure 1:
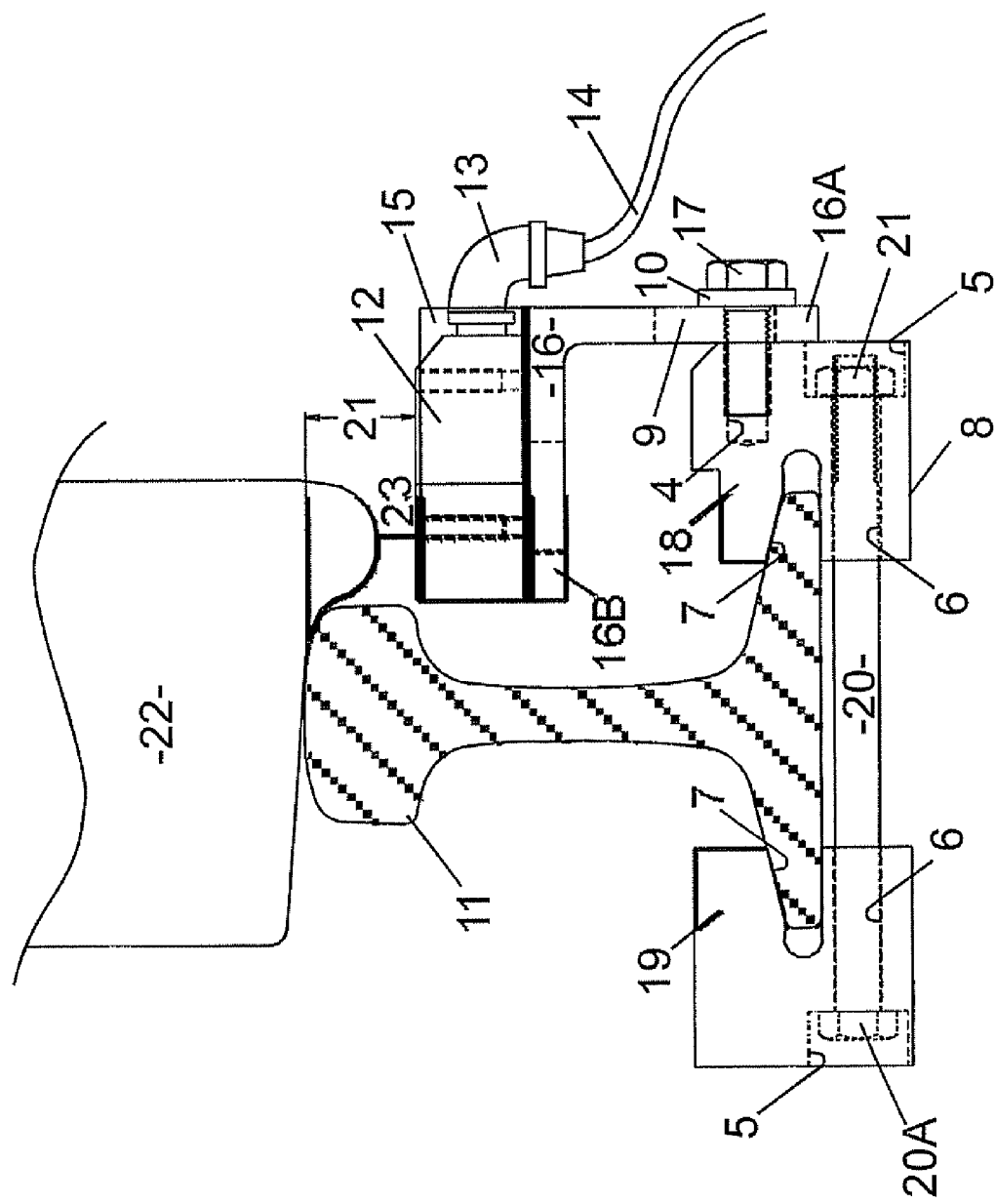
FIG. 1 is an end elevation view of the wheel sensor assembly of the present invention mounted on a rail with a car wheel on the rail and the rail in section.
Figure 2:
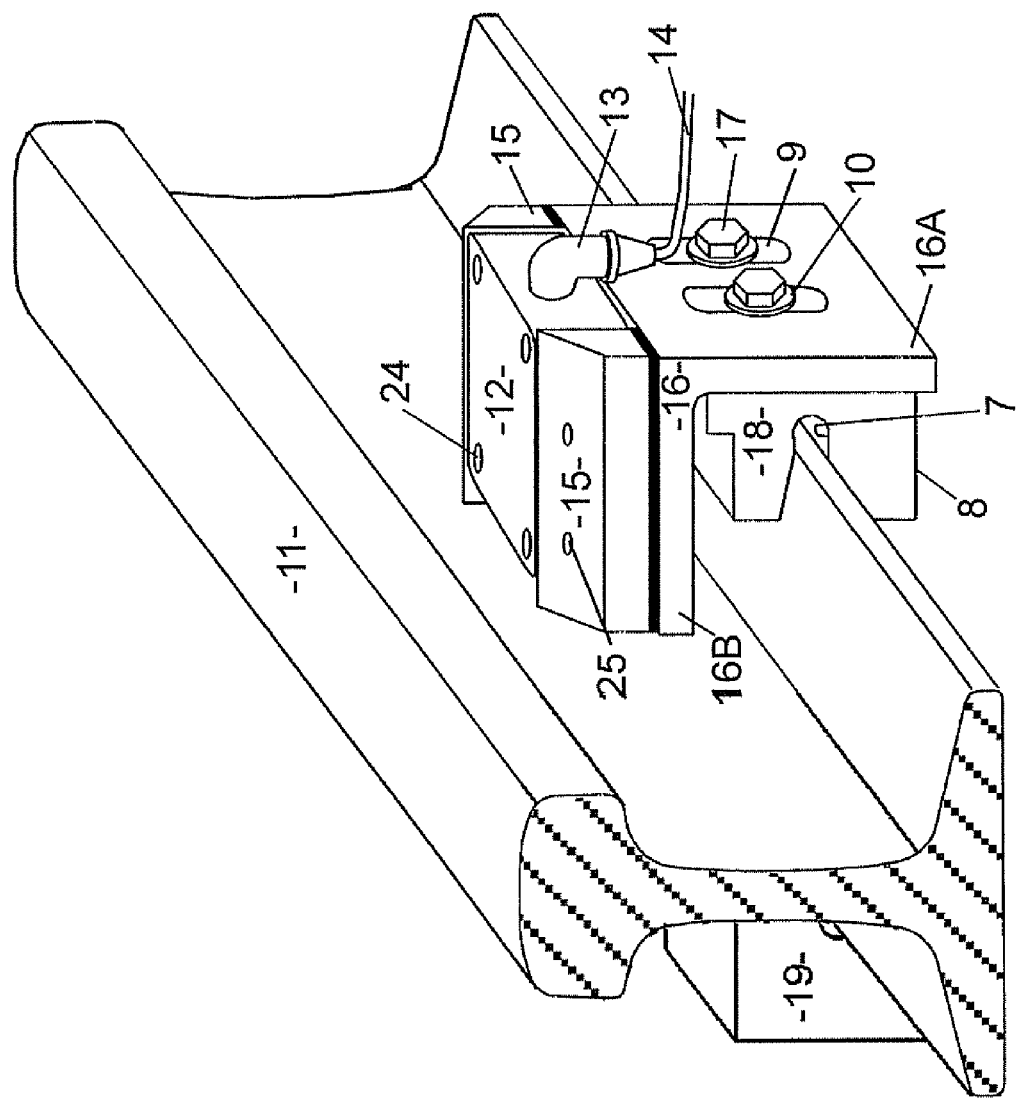
FIG. 2 is an isometric view of the wheel sensor assembly.

The general arrangement of a preferred embodiment, constructed to be best suited for North American applications, is shown in FIGS. 1 and 2. The rail shown 11 is 136 RE rail, however any rail section can be used. For example, for use on lighter rail such as 115 RE or 119 RE, an adapter plate is used for accurate installation as will be discussed in further detail below. The wheel 22 on top of the rail is a standard new wheel cross-section used for freight hauling. The wheel sensor assembly shown can be mounted without any lateral adjustment of the sensor on any rail section of 132 RE and higher weight.

The rail wheel sensor assembly includes a clamp, shown generally at 8, which attaches to the base of the rail 11. The clamp 8 includes a gauge-side block 18 and a field-side block 19. Each block has a groove or slot 7 in one face thereof. The groove has a tapered portion toward the outside of the block which is angled appropriately to accommodate the angle of the rail base. The groove terminates at a rounded, inner portion. Each block 18, 19 further includes a lower extension portion through which extend a pair of bores 6. Counterbores 5 are formed on the outer faces of the blocks. The bores 6 extend fully through the block underneath the grooves 7. A pair of threaded apertures 4 are formed in an upper portion of the gauge-side block 18. The clamp is completed by a pair of bolts 20 which have bolt heads 20A at one end and threads at the other end.

Attachment of the clamp 8 to a rail 11 is straightforward. After clearing a space in the crib between two ties, the gauge-side block 18 is placed on the gauge-side flange of the rail base with the slot 7 engaging the rail base. The field-side block 19 is similarly placed on the field-side flange of the rail base, with its bores 6 in alignment with those of the gauge-side block 18. The bolts 20 are then placed through the bores 6 of the field side block 19 until the bolt heads 20A are in the counterbore 5. Nuts 21 are then threaded onto the other ends of the bolts until the nuts are tight in the counterbores 5 of the gauge-side block 18.

An L-shaped mounting bracket 16 is adjustably fixed to the clamp 8. Bracket 16 includes a vertical leg 16A and a horizontal platform 16B. The vertical leg 16A has a pair of elongated slots 9 cut therein. The slots receive two threaded mounting bolts 17. The mounting bolts are sized to fit through the slots 9 and into the apertures 4 of the gauge-side block 18. Lock washers 10 are engageable with the outer face of the vertical leg 16A to adjustably fix the vertical position of the platform 16. The L-shaped platform 16 can be adjusted vertically to achieve the correct distance of a sensor 12 from the top of the rail. This distance 23 is designed to be approximately ¾ inches for a new wheel. For an extremely worn wheel this distance may be approximately ¼ inches.

A rail sensor 12 is mounted with four screws 24 on the top surface of the platform 16B. Shields 15 are present on either side of the sensor to protect it. The shields 15 are made of a non-inductive material. Alternately, the shields could also be made of inductive material, such as steel, but non-inductive material is preferred. They are held in place on the platform 16B with four mounting screws 25 that are tightened with a thread-locking fluid. A sensor cable 14 is connected to the sensor 12 through an elbow section 13. The sensor is an inductive proximity sensor which has a sensing area that is approximately a 2½-inch diameter circle. The vertical sensing range of the sensor is 2 inches or more. The sensor may be an AC or DC inductive sensor with a two or three wire connection. The sensor is housed in a rugged and weatherproof enclosure. Its response time is adapted to be fast enough for sensing the moderate speeds of North American traffic.

Figure 3:
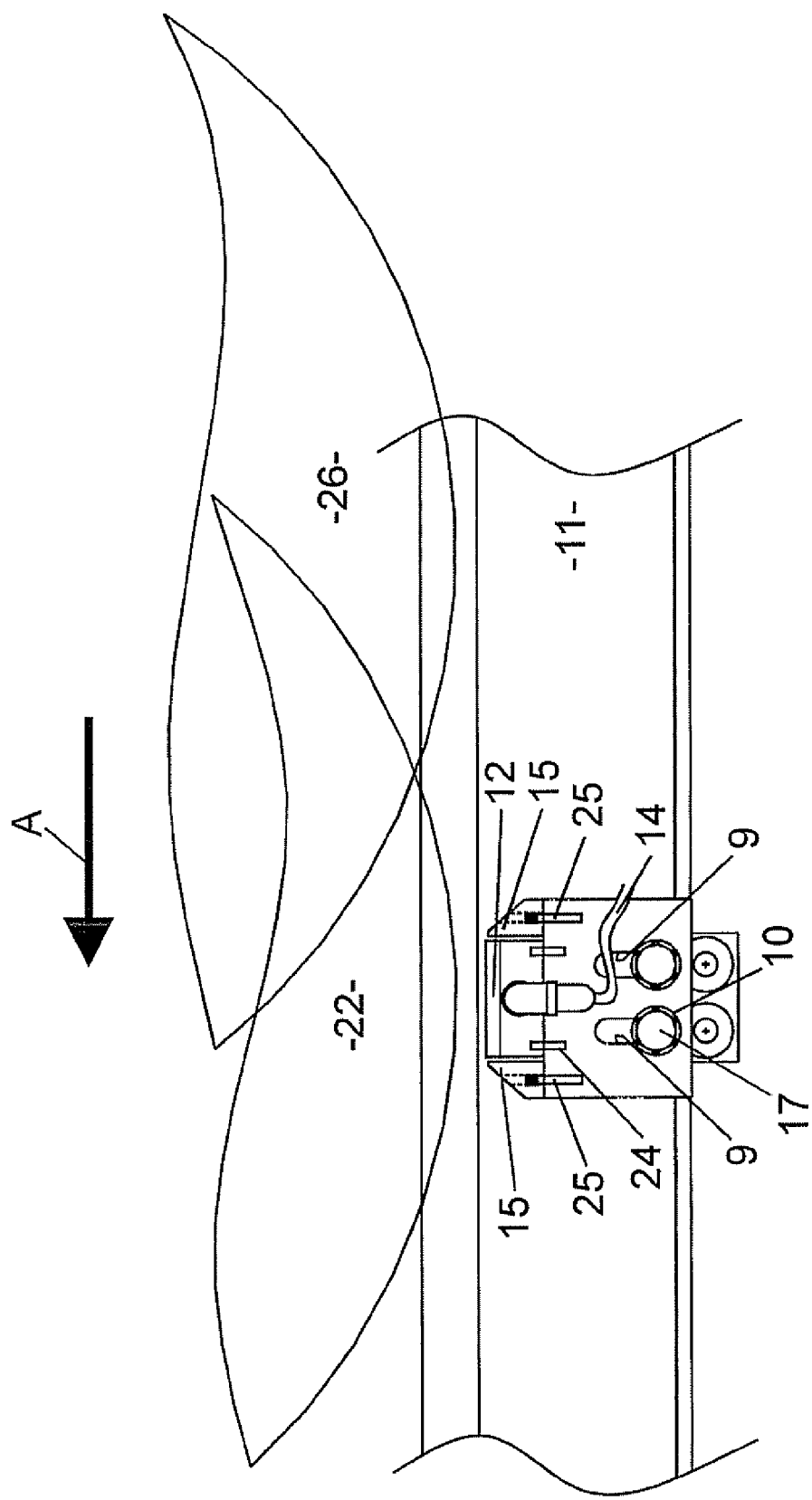
FIG. 3 is a side elevation view of the wheel sensor assembly, looking toward the gauge side of the rail and showing a car wheel in two different positions.

FIG. 3 shows a wheel moving on the rail 11 in the direction of arrow A. Wheel positions 26 and 22 show the movement of the wheel. Because of the sensor range of 2 inches or more, the wheel can be sensed for a longitudinal distance on the rail of 5 inches or more. FIG. 3 shows the L-shaped platform 16 with the slots 9 and the bolts 17 with locking washers 10, the sensor 12 bounded by the shields 15, and the connecting cable 14 with the elbow connection 13.

Figure 4:
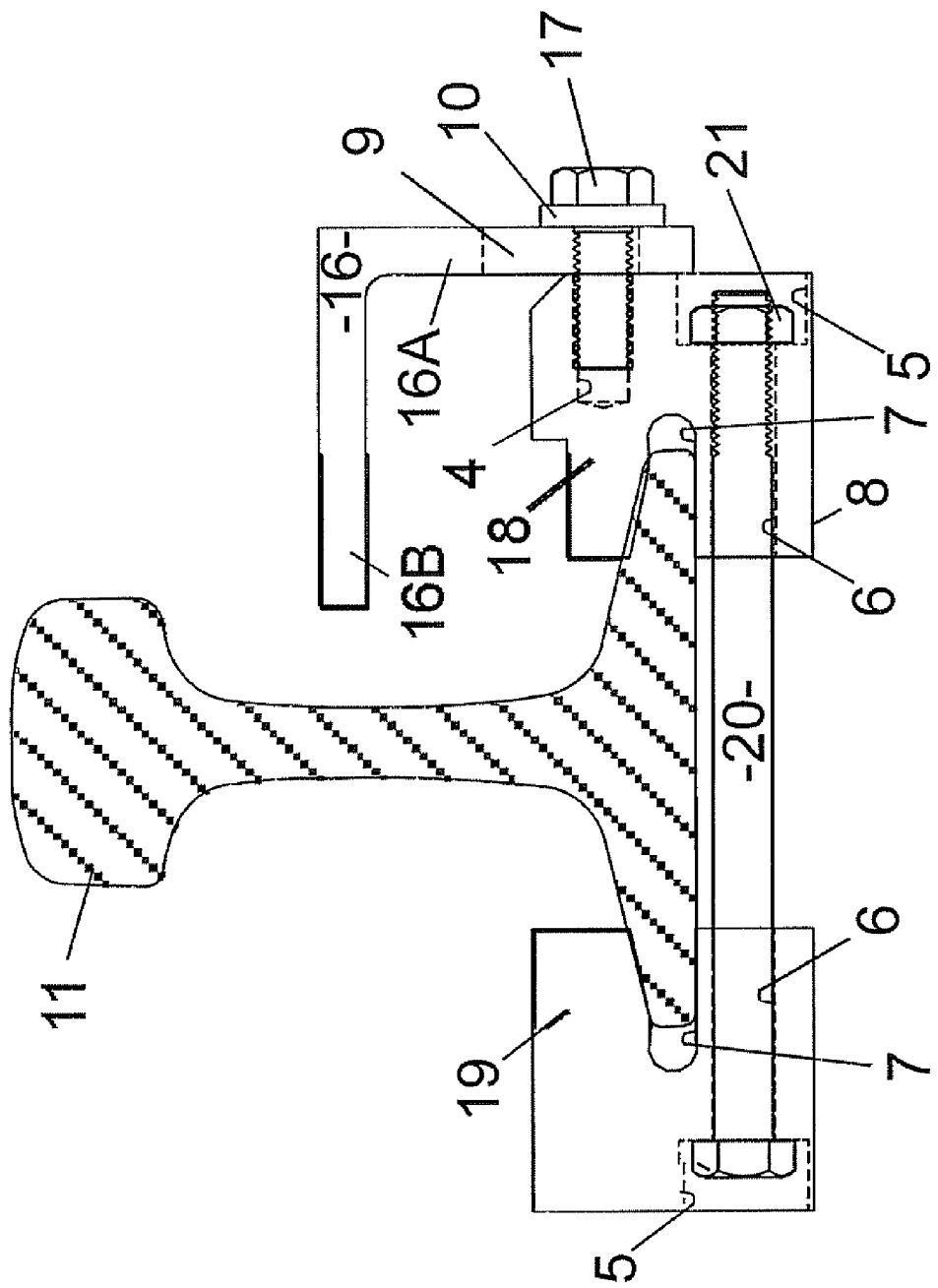
FIG. 4 is a view similar to FIG. 1 showing only the rail clamp and mounting bracket.

FIG. 4 shows the clamp 8 and mounting platform 16. This is considered a suitable arrangement to mount other sensors or devices adjacent to the rail. It also shows the bolts 17, 20 the nuts 21, the lock washer 10 and the slot 9.

Figure 5:
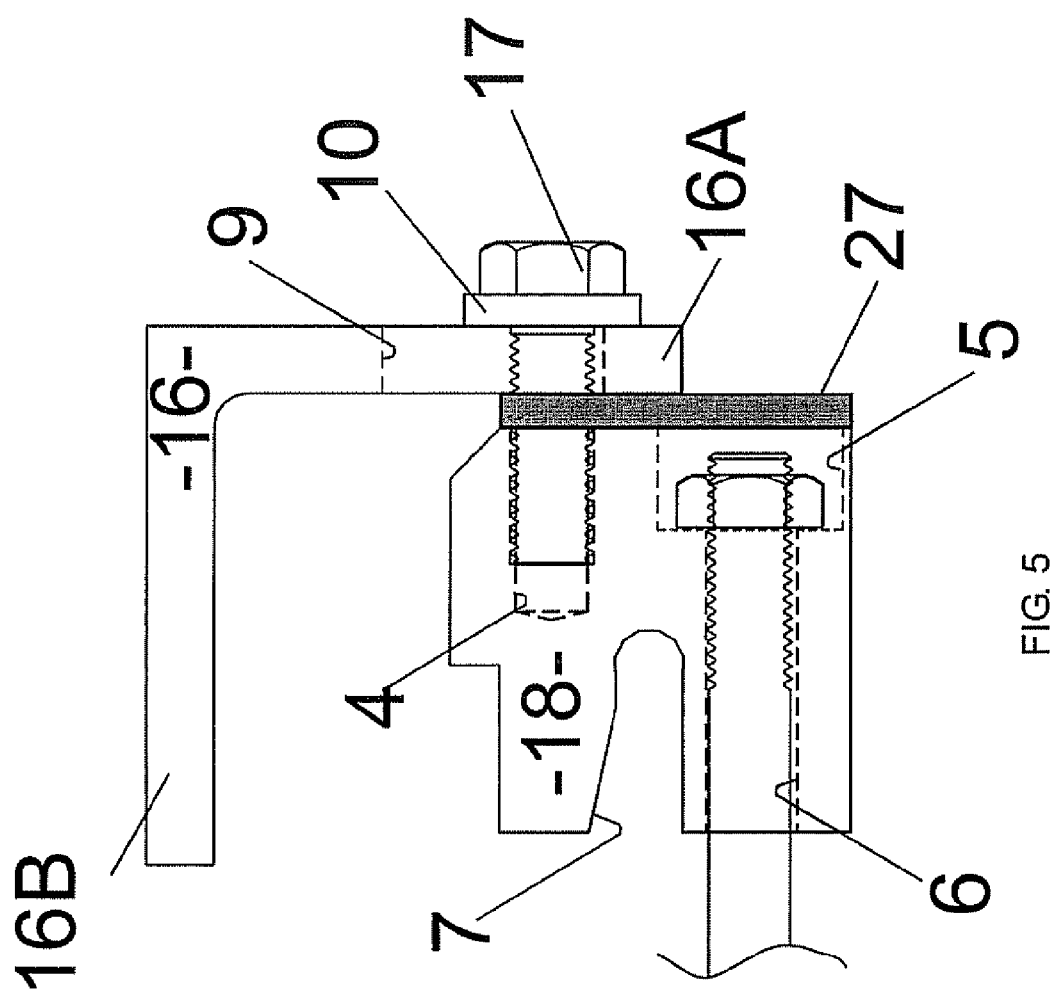
FIG. 5 is an enlarged end elevation view of the gauge side clamp block, the mounting bracket and an adaptor plate between them.

FIG. 5 shows an alternate embodiment of a gauge-side block 18 and mounting bracket 16 having an adapter 27 for use with the standard unit for lighter rail. The lighter rail has a narrower base and also a narrower railhead. This adapter 27 can provide exact positioning of the sensor on such rails. It also shows the steel gauge-side block 18, the mounting platform bracket 16, and the bolt 17 with the locking washer 10.

Figure 6:
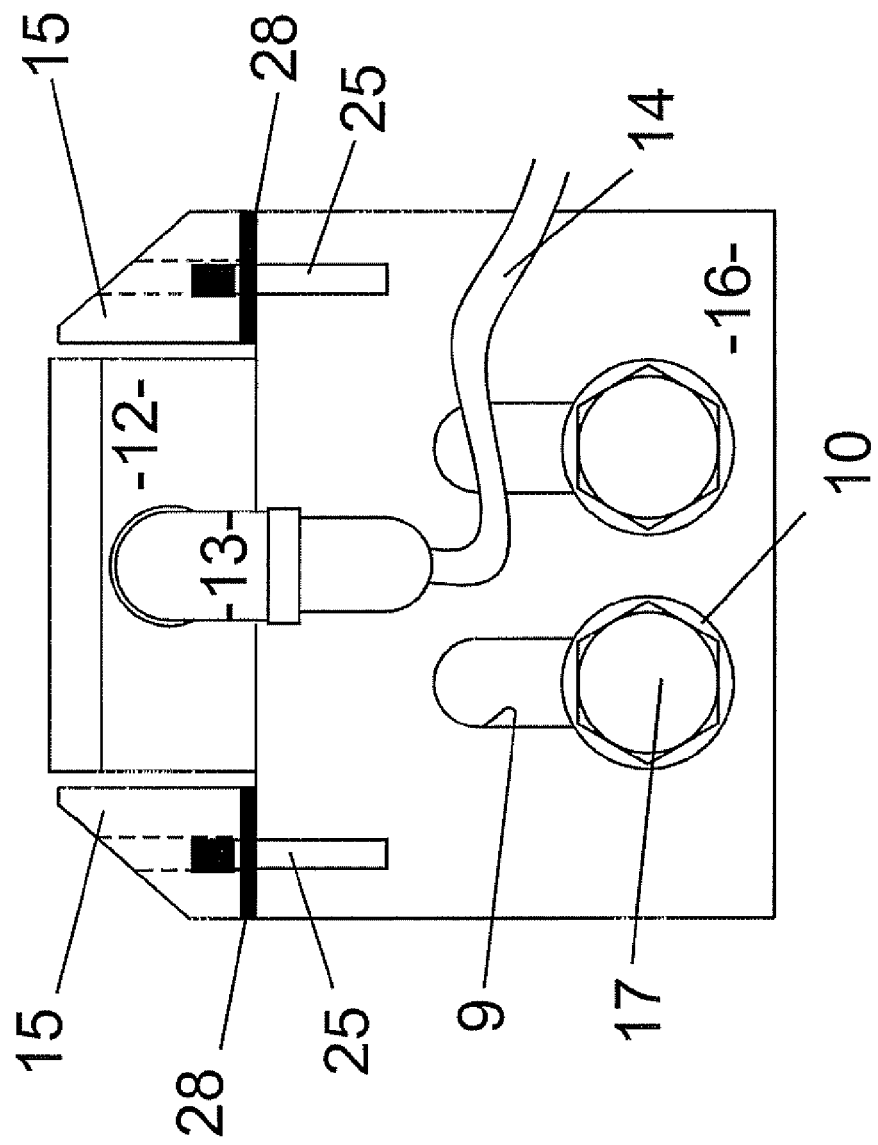
FIG. 6 is an enlarged side elevation view of an alternate embodiment of the mounting bracket, showing a layer of shock-reducing material under the shields.

FIG. 6 shows an alternate arrangement for mounting the shields 15. While the shield material is strong, its ability to withstand lateral impacts will be increased with the use of a shock-absorbing cushion 28 which may be made of an elastomeric or other energy absorbing material. The cushion is located between the horizontal platform 16B and the base of the shield, as seen in FIG. 6.

The embodiments described herein provide a mounting of wheel sensor assembly for rail base mounting which is rugged and which allows for considerable variations in the wheels and rails and their degree of wear. The system does not require accurate installation and will continue to function under the widely varying conditions and degree of maintenance of railroads in North America and elsewhere.

While this invention has been described with reference to certain illustrative aspects, it will be understood that this description shall not be construed in a limiting sense. Rather, various changes and modifications can be made to the illustrative embodiments without departing from the true spirit and scope of the invention as defined by the following claims. For example, the preferred embodiment has been constructed for optimal use in North American applications. The invention may, however, be easily adapted to comply with other regional applications. Moreover, as described herein, the mounting bracket may be adapted to carry devices other than wheel sensors. It is further contemplated that adapters for use in lighter or even heavier rails can be utilized. Also, shields or other energy absorbing material may be used in conjunction with this invention. It will be appreciated that any such changes and modifications including, but not limited to those discussed herein, will be recognized by those skilled in the art as an equivalent to one or more elements of the following claims, and such modifications may be made without departing from the scope of the following claims.

We claim:

1. A mounting system for mounting devices contained within a housing adjacent to a rail having a rail head, a web and a base, the base having a gauge-side flange and a field-side flange, comprising:
   a mounting bracket adapted for attachment to the rail and adapted for carrying the device; and
   at least one shield in cooperative association with the mounting bracket and in relation to the housing for protecting both the device and the housing from impacts with train-born objects.

2. The mounting system of claim 1, wherein the mounting bracket further comprises a platform adapted to carry both the shield and the device in relation to each other.

3. The mounting system of claim 2, wherein the mounting bracket is situated such that the platform of the mounting bracket carries the device below the wheel of a rail car on the rail.

4. The mounting system of claim 1, further including a clamp in cooperative association with the mounting bracket, said clamp having a block engageable with the rail.

5. The mounting system of claim 4, further comprising an adapter insertable between the clamp and the mounting bracket for accommodating lighter or heavier rails, and when inserted between the clamp and mounting bracket, the adapter contacts both the clamp and mounting bracket to position the mounting bracket a preselected distance from the clamp.

6. The mounting system of claim 4, wherein the block is engageable with gauge-side flange of the rail base.

7. The mounting system of claim 4, wherein the block is engageable with the field-side flange of the rail base.

8. The mounting system of claim 4, wherein the block is a gauge-side block and the clamp includes a field-side block, each block having extension portions disposed below the bottom of the rail base when the blocks are engaged with the rail, the extension portions each having at least one bore therethrough, and the clamp further comprises a bolt extending though the bores of the blocks.

9. The mounting system of claim 1, further comprising a layer of shock-reducing material between the mounting bracket and the shield.

10. The mounting system of claim 1, wherein the shield for protecting said sensor is constructed of a non-inductive material.

11. The mounting system of claim 1, further comprising a second shield in cooperative association with the mounting bracket, wherein the device is disposed between the first and second shields for protection thereof.

12. The mounting system of claim 1, wherein the device is a rail wheel sensor.

13. The mounting system of claim 12, wherein the rail wheel sensor is an electrically inductive proximity sensor.

14. The mounting system of claim 13, wherein the rail wheel sensor is an AC inductive sensor.

15. The mounting system of claim 13, wherein the rail wheel sensor is a DC inductive sensor.

16. The mounting system of claim 1, wherein the mounting bracket is a generally L-shaped mounting bracket having a vertical leg and a platform for carrying said device.

17. The mounting system of claim 16, further including a rail clamp having a block being connectable to the vertical leg and being adapted to grip the base of the rail.

18. The mounting system of claim 17, wherein the vertical leg of the L-shaped mounting bracket is adjustably connected to the block.

19. The mounting system of claim 17, wherein the vertical leg of the L-shaped mounting bracket is adjustably connected to the block such that the mounting bracket may be vertically adjusted with respect to the height of the rail.

20. A mounting system for mounting devices contained within a housing adjacent to a rail having a rail head, a web and a base, the base having a gauge-side flange and a field-side flange, comprising:
   a mounting bracket adapted to carry the device,
   a rail clamp in cooperative association with the mounting bracket adapted to grip the base of the rail,
   a shield in cooperative association with the mounting bracket and in relation to the housing for protecting both the device and the housing from fin acts with train-born objects, and
   an adapter removably insertable between the clamp and the mounting bracket for accommodating lighter or heavier rails.

21. The mounting system of claim 20, wherein the mounting bracket further comprises a platform adapted to carry the device.

22. The mounting system of claim 21, wherein the mounting bracket is situated such that the platform of the mounting bracket carries the device below the wheel of a rail car on the rail.

23. The mounting system of claim 20, wherein the clamp includes a block engageable with the rail.

24. The mounting system of claim 23, wherein the adapter is insertable between the block and the mounting bracket for accommodating lighter or heavier rails.

25. The mounting system of claim 23, wherein the block is engageable with gauge-side flange of the rail base.

26. The mounting system of claim 23, wherein the block is engageable with the field-side flange of the rail base.

27. The mounting system of claim 23, wherein the block is a gauge-side block and the clamp includes a field-side block, each block having extension portions disposed below the bottom of the rail base when the blocks are engaged with the rail, the extension portions each having at least one bore therethrough, and the clamp further comprises a bolt extending through the bores of the blocks.

28. The mounting system of claim 20, wherein the device is a rail wheel sensor.

29. The mounting system of claim 20, wherein the mounting bracket is a generally L-shaped mounting bracket having a vertical leg and a platform for carrying said device.

30. The mounting system of claim 29, wherein the adapter is insertable between the clamp and the vertical leg of the mounting bracket for accommodating mounting on lighter or heavier rails.

31. The mounting system of claim 29, in which the rail clamp has a block being connectable to the vertical leg and being adapted to grip the base of the rail.

32. The mounting system of claim 31, wherein the adapter is insertable between the block of the clamp and the vertical leg of the mounting bracket for accommodating mounting on lighter or heavier rails.

33. The mounting system of claim 31, wherein the vertical leg of the L-shaped mounting bracket is adjustably connected to the block.

34. The mounting system of claim 33, wherein the vertical leg of the L-shaped mounting bracket is adjustably connected to the block such that the mounting bracket may be vertically adjusted with respect to the height of the rail.

35. The mounting system of claim 20, wherein the adapter is an adapter plate.

* * * * *